United States Patent

Kazuto

[11] Patent Number: 6,127,460
[45] Date of Patent: Oct. 3, 2000

[54] LIQUID EPOXY RESIN POTTING MATERIAL

[75] Inventor: Onami Kazuto, Utunomiya, Japan

[73] Assignee: Sumitomo Bakelite Co., Ltd., Tokyo, Japan

[21] Appl. No.: 09/193,620

[22] Filed: Nov. 17, 1998

Related U.S. Application Data

[63] Continuation-in-part of application No. 08/982,913, Dec. 2, 1997, abandoned.

[51] Int. Cl.[7] ............................... C08K 3/36; C08L 63/02
[52] U.S. Cl. .......................................... 523/443; 525/333.2
[58] Field of Search ..................................... 523/440, 443; 525/333.2

[56] References Cited

U.S. PATENT DOCUMENTS 5,476,884  12/1995  Kayaba et al. ........................... 523/443

FOREIGN PATENT DOCUMENTS 06085117  3/1994  Japan .

OTHER PUBLICATIONS

Chem Abstracts, 121 (10), No. 110613, Sep. 5, 1994 and Abstract of JP 06085117A, Mar. 25, 1994.
Derwent AN–93–042615 and abstract of JP–04370137.
Chem. Abstracts, 127 (10), No. 136836, Sep. 8, 1997 and abstract of JP 09176294A, Jul. 8, 1997.
Chem. Abstracts, 127 (19), No. 263657, Nov. 10, 1997 and abstract of JP 09235357A, Sep. 9, 1997.
Derwent AN 88–224289 and abstract of JP 63159423A, Jul. 2, 1988.
Derwent AN 75–69608 W and abstracts of JP 50033300, Mar. 31, 1995.
Derwent AN 92–376323 and abstract JP 04275325A, Sep. 30, 1992.

*Primary Examiner*—Robert Dawson
*Assistant Examiner*—D. Aylward
*Attorney, Agent, or Firm*—Eugene Lieberstein; Michael N. Meller

[57] ABSTRACT

A liquid epoxy resin potting material comprising four components: component A, a liquid epoxy resin; component B, a liquid alkylated diaminodiphenylmethane; component C, an epoxidized polybutadiene elastomer; and component D, an inorganic filler, wherein the weight ratios of components A, B, C and D are:

A/(A+B)=about 0.65 to about 0.80
C/(A+B)=about 0.01 to about 0.05 and
D/(A+B+C+D)=about 0.50 to about 0.80.

11 Claims, No Drawings

LIQUID EPOXY RESIN POTTING MATERIAL

CROSS-REFERENCE TO RELATED APPLICATIONS

This application is a continuation-in-part of application Ser. No. 08/982,913 filed Dec. 2, 1997, abandoned.

Field of the Invention

The present invention relates to a liquid resin potting material used for potting semiconductors.

Background of the Invention

The lower cost and higher integration trends in semiconductor packaging has shifted in packaging form from the conventional transfer molding DIP (dual online packaging) to COB (chip on board), PPGA (plastic pin grid array) and the like. A liquid potting material is used for potting the PPGA-type of semiconductor, but it is unreliable as compared to a ceramic-based hermetic type. The reasons for such unreliability includes items such as moisture penetrating through the package-fabricated organic printed circuit boards. Unlike transfer molding DIPs, a liquid potting material, when allowed to flow and mold under no pressure, results in residual gas bubbles which lead to cracks when subjected to thermal stresses. When the potting material has a different coefficient of linear expansion, from that of the semiconductor chip or the organic baseboard, a delamination occurs at the interface occurs at the interface when subjected to a thermal stress, which facilitates moisture penetration, etc.

Published Japanese Patent Application 06-85117 discloses a resin potting material for potting semiconductors comprising a liquid multi-functional epoxy resin, epoxidized liquid polybutadiene, aromatic amine and polyphenolic reaction product and an inorganic filler. However, such potting material suffers from a lack of fluidity and workability.

OBJECT OF THE INVENTION

It is an object of the invention to provide a potting material which exhibits substantially improved semiconductor reliability when subjected to an accelerated test such as the PCT (pressure cooker test) or T/C (cold-heat cycle test) and the like.

SUMMARY OF THE INVENTION

The present invention is directed to a liquid epoxy resin potting material comprising a liquid epoxy resin, an aromatic diamine, an elastomer and an inorganic filler.

DETAILED DESCRIPTION OF THE INVENTION

The potting material of the invention comprises the following components:

A. a liquid epoxy resin;
B. a liquid alkylated diaminodiphenylmethane;
C. an epoxidized polybutadiene elastomer; and
D. an inorganic filler.

Preferably, the weight ratios of components A, B, C and D are as follows:

A/(A+B)=about 0.65 to about 0.80
C/(A+B)=about 0.01 to about 0.05
D/(A+B+C+D)=about 0.50 to about 0.80.

As discussed below, a potting material that utilizes the four components within the weight ratio ranges indicated above exhibits substantially improved reliability when employed in potting a PPGA-type semiconductor that uses an organic printed circuit board.

At least 50 wt. % of component A, i.e. the liquid epoxy resin preferably has a viscosity at 25° C. of not more than 8Pa·s. Preferably component A, i.e. the liquid epoxy resin component, should be a low viscosity epoxy resin, since higher viscosities favor entrainment of gas bubbles as well as a tendency to not completely fill the corner edges when the PPGA package is potted by allowing the liquid potting material to flow, thereby reducing reliability. The viscosity of the epoxy resin component is measured by using an E-type viscometer (manufactured by TokiSangyo KK) at 25° C. if the sample is a liquid at room temperature and measured at 150° C. using a high temperature cone plate viscometer if the sample is a solid at room temperature.

Any epoxy resin may be used as component A, i.e. the liquid epoxy resin, provided the it meets the requirements set forth above. Preferably, the liquid epoxy resin is aromatic in nature. Suitable epoxy resins include bisphenol-A diglycidyl ether-type epoxy resin; bisphenol-F diglycidyl ether-type epoxy resin; bisphenol-S diglycidyl ether-type epoxy resin; 3,3',5,5-tetramethyl-4,4-dihydroxybiphenyl diglycidyl ether-type epoxy resin; 1,6-dihydroxynaphthalene diglycidyl ether-type epoxy resin; phenol novolak-type epoxy resin; cresol novolak-type epoxy resin; brominated bisphenol-A diglycidyl ether-type epoxy resin; brominated cresol novolak-type epoxy resin and the like. The foregoing epoxy resins may be used as individual epoxy resins or as combinations of two or more of such epoxy resins.

Component B, i.e. the liquid alkylated diaminodiphenylmethane, is a diaminodiphenylmethane in which at least one of the hydrogen atoms of the benzene rings is substituted by a $C_1$–$C_4$ alkyl group such as methyl, ethyl, etc. Unsubstituted diaminodiphenylmethanes are undesirable since they result in compositions having high viscosities which favor entrainment of gas bubbles as well as a tendency to not completely fill the corner edges when the package is potted by allowing the liquid potting material to flow, thereby reducing reliability. Any alkylated diaminodiphenylmethane meeting the above requirements may be used. Suitable alkylated diaminodiphenylmethanes include 3,3'-diethyl-4,4'-diaminodiphenylmethane; 3,3',5,5'-tetramethyl-4,4'-diamino-diphenylmethane; 3,3',5,5'-tetramethyl-4,4'-diamino-diphenylmethane and the like. The foregoing alkylated diaminodiphenylmethanes may be used as individual alkylated diaminodiphenylmethanes or as combinations of two or more of such alkylated diaminodiphenylmethanes.

As indicated above, it is preferred that the weight ratio of the liquid epoxy resin (component A) and the liquid alkylated diaminodiphenylmethane (component B) be in the range of A/A+B=about 0.65 to about 0.80. If the foregoing ratio exceeds about 0.80, an increased number of unreacted epoxy groups is produced, thereby decreasing the heat resistance such as the glass transition temperature and the like and also causing an undesirable reduction in reliability as determined by the cold-heat cycle test. On the other hand, a ratio below about 0.65 is not desirable since it produces a decreased storage life for the composition.

The epoxidized polybutadiene elastomer (component C) employed in this invention preferably has a number average molecular weight of about 1,000 to about 5,000. A number average molecular weight below about 1,000 is undesirable since it results in decreased flexibility of the composition, while a number average molecular weight above about 5,000 is undesirable since it increase the viscosity and reduces the workability of the composition. The number of epoxy groups in the molecule (i.e. the mole % fraction incorporated into the main chain) is relatively small, e.g. about 3 to about 10 mole %. A mole fraction of less than about 3% is undesirable because the epoxidized polybutadiene elastomer will not be fully compatible with the liquid epoxy resin (component A), while a mole fraction of greater than about 10% is undesirable since this would result in epoxy groups reacting with a hardening agent, thereby failing to produce a "sea-island" structure with no prospect of reducing stress and resulting in a concomitant reduction in flexibility. Use of the epoxidized polybutadiene elastomer (component C) in the preferable weight ratio of C/A+B= about 0.01 to about 0.05 produces a relaxation of thermal stresses which occur during the cold-heat cycle test. A ratio of less than about 0.01 is undesirable since it results in an insignificant improvement in stress relaxation, whereas a ratio of greater than about 0.05 is undesirable since it would result in a cured product having a decrease glass transition temperature, a rise in composition viscosity and reduced compatibility with the liquid epoxy resin and also results in a blooming which rises to the surface of the cured product.

The inorganic filler (component D) comprises fused silica, crystalline silica and the like. Such fillers are available in spherical form, ruptured form and the like. The spherical form of the filler is preferred since it permits the incorporation of a large amount of filler, thereby reducing the coefficient of linear expansion. Preferably, the weight ratio of the inorganic filler (component D) is in the range of D/(A+B+C+D)=about 0.50 to about 0.80. A weight ratio of less than about 0.50 is undesirable since it produces only a small effect in reducing the coefficient of linear expansion, while a ratio exceeding about 0.80 is undesirable since it results in an increase in the viscosity of the composition, thereby decreasing workability. In general, a small particle-sized filler results in an increase in the viscosity of the composition, thereby producing decreased flow, gas bubble entrainment and insufficient fillings to the edges of the semiconductor package. On the other hand, a large particle-sized filler tends to undergo sedimentation, which results in a nonuniform distribution of the filler. Nonuniform filler distribution will result in portions of the composition having different coefficients of linear expansion, with the top portions having lower amounts of filler having a tendency to experience more crack formation. If the filler particle size is greater than the interval of a wire, there will be a tendency to insufficiently fill beneath the wires and the creation of a short-circuiting problem due to wire distortion.

An investigation into the filler particle size problems discussed above has led to the finding of the optimum filler type and particle size. It is particularly preferred that the filler comprises a combination of (1) a spherical silica having an average particle size of about 0.1 to about 3.0 μm and a maximum particle size of about 10 μm, and (2) a spherical silica having an average particle size about 4 to about 10 μm and a maximum particle size of about 50 μm, the weight ratio of filler (1) to filler (2) being in the range of (1)/(1)+(2)=about 0.05 to about 0.50. It has been found that such particularly preferred combination enables suppression of sedimentation without a loss of flow characteristics. Any type of spherical silica which meets the foregoing requirements is especially useful for the purposes of this invention and each of filler (1) and filler (2) may be used individually or in a blend of two or more types of such spherical silicas.

The foregoing average and maximum particle sizes were measured by a laser-type method (Horiba LA-500) wherein the average particle size was based on a median size.

The liquid potting material of the invention may contain, in addition to the four components recited above, other additives as desired, e.g. other resins, catalysts for promoting the reaction, diluents, pigments, coupling agents, leveling agents, defoamers and the like. The liquid potting material of the invention may be readily prepared by dispersing and kneading the four components and any other desired additives using a three-roll mill followed by vacuum-defoaming.

EXAMPLES OF THE INVENTION

The present invention is illustrated by the following nonlimiting examples. Unless otherwise indicated, all parts and percentages are on a weight basis.

EXAMPLES 1–6

Liquid potting mixes were prepared from the ingredients listed below; the amount of each ingredient, in parts by weight, is set forth in Table 1:

Bisphenol-F-type epoxy resin having an epoxy equivalent of 161 and a viscosity at 25° C. of 1.5 Pa·s measured at 25° C. on an E-type viscometer at 2.5 rpm Bisphenol-A-type epoxy resin (1) having an epoxy equivalent of 171 and a viscosity at 25° C. of 4.5 Pa·s measured on an E-type viscometer at 2.5 rpm 1,6-dihydroxynaphthalene-type epoxy resin having an epoxy equivalent of 140 and a viscosity at 25° C. of 25 Pa·s measured on an E-type viscometer at 2.5 rpm 3,3'-diethyl-4,4'-diaminodiphenylmethane 3,3'5,5'-tetramethyl-4,4'-diaminodiphenylmethane Epoxidized polybutadiene elastomer having a number average molecular weight of 1,800 and an epoxy equivalent of 250

Spherical fused silica (1) having an average particle size of 6 μm and a maximum particle size of 48 μm Spherical fused silica (2) having an average particle size of 0.5 μm and a maximum particle size of 2 μm Spherical fused silica (3) having an average particle size of 2.0 μm and a maximum particle size of 8 μm Spherical fused silica (4) comprising a 1:1 blend of spherical fused silicas (2) and (3); the average particle size of the blend was 1.0 μm and a maximum particle size of 8 μm The ingredients listed above were dispersed and kneaded on a three-roll mill and vacuum-defoamed to provide a liquid epoxy resin potting material which was used to pot a PPGA package. The composition was dispensed in the PPGA package at 80° C. to confirm the ease of filling in the cavities of the package 5 minutes later. After potting, the PPGA package was oven-cured at 165° C. for three hours to provide a semiconductor package. The methods of evaluation indicated below were used to confirm: (i) any delamination between the semiconductor chip and print baseboard, (ii) the presence of any cracks and (iii) filler sedimentation. The results of the evaluations are set forth in Table 1.

After curing, the semiconductor package was inspected for the presence of any delamination and any cracks under three conditions: (a) ambient temperature and pressure; (b) PCT (pressure cooker treatment) at 125° C. and 2.3 atm for 168 hours; and (c) T/C (cold-heat cycle test) treatment at −65° C./30 minutes–150° C./30 minutes, 1,000 cycles. The presence of any delamination and any cracks in the semiconductor package was confirmed using a supersonic defect tester (hereinafter referred to as "SAT").

Filler sedimentation was evaluated in the following manner: A cured package was cut across and observed at the cross-section using a scanning electron microscope (hereinafter referred to as "SEM") to measure the extent of sedimentation from the top of the cured product.

Ten packages were used for each evaluation. As may be seen from the results set forth in Table 1, the packages prepared in Examples 1–6 showed no delamination or cracks, but a slight amount of filler sedimentation. Such results are indicative of good reliability.

Comparative Examples 1–6

Liquid epoxy resin potting materials were prepared in a manner similar to that of Examples 1–6, except that the ingredients set forth below were used to prepare these potting materials; the amount of each ingredient, in parts by weight is set forth in Table 1. The potting materials were used to pot PPGA packages to evaluate the reliability of these potting materials. The results of such evaluations which were carried out in the same manner as recited in Examples 1–6 are set forth in Table 2. The following ingredients were used in Comparative Examples 1–6:

Bisphenol-F-type epoxy resin having an epoxy equivalent of 161 and a viscosity at 25° C. of 1.5 Pa·s measured on an E-type viscometer at 2.5 rpm Bisphenol-A-type epoxy resin (1) having an epoxy equivalent of 171 and a viscosity at 25° C. of 4.5 Pa·s measured on an E-type viscometer at 2.5 rpm Bisphenol-A-type epoxy resin (2) having an epoxy equivalent of 470 (solid material)

3,3'-diethyl-4,4'-diaminodiphenylmethane

Epoxidized polybutadiene elastomer having a number average molecular weight of 1,800 and an epoxy equivalent of 250

Spherical fused silica (1) having an average particle size of 6 $\mu$m and a maximum particle size of 48 $\mu$m Spherical fused silica (2) having an average particle size of 0.5 $\mu$m and a maximum particle size of 2 $\mu$m Spherical fused silica (5) having an average particle size of 17.0 $\mu$m and a maximum particle size of 75 $\mu$m Comparative Example 7

Liquid reaction product (AA) was obtained by mixing 7 parts of Novolak-type polyphenol (hydrogen base equivalent of 105) and 36 parts of ethyldiaminodiphenylmethane (amine equivalent of 64), melting the two ingredients at 100° C. and reacting them for 3 hours. Thereafter, 100 parts of bisphenol-A-type epoxy resin (1), 25 parts of epoxidized polybutadiene elastomer having a number average molecular weight of 1,800 and an epoxy equivalent of 250 and 430 parts of spherical fused silica (1) were added to reaction product (AA), agitated for 30 minutes and mixed on a three-roll mill to provide a homogenous liquid epoxy resin material. A PPGA package was potted with this material and was evaluated in the same manner as recited in Examples 1–6. The results are shown in Table 2.

Comparative Example 8

Liquid reaction product (BB) was obtained using 50 parts of Novolak-type polyphenol (hydrogen base equivalent of 105) and 10 parts of ethyl diaminodiphenylmethane (amine equivalent of 64), melting the two ingredients at 100° C. and reacting them for 3 hours. Thereafter, 60 parts of bisphenol-A-type epoxy resin (1), 25 parts of epoxidized polybutadiene elastomer having a number average molecular weight of 1,800 and an epoxy equivalent of 250, and 430 parts of spherical fused silica (1) were added to reaction product (BB), agitated for 30 minutes and mixed on a three-roll mill to provide a homogenous liquid epoxy resin material. A PPGA package was potted with this material and evaluated in the same manner as recited in Examples 1–6. The results are shown in Table 2.

As may be seen from Tables 1 and 2, the results of Examples 1–6 (the present invention) when compared to Comparative Examples 1–8 (prior art) indicate that the liquid epoxy resin potting material of the invention provides a semiconductor package which is highly reliable and is free of delamination or cracks without any adverse effects on flow or workability. Thus, the liquid epoxy resin potting materials of the invention provide distinct advantages over prior art materials to manufacturers of semiconductor packages.

TABLE 1

| Example | 1 | 2 | 3 | 4 | 5 | 6 |
|---|---|---|---|---|---|---|
| Bisphenol-F-type epoxy resin | 100 | 100 | 100 |  | 100 | 50 |
| Bisphenol-A-type epoxy resin(1) |  |  |  | 100 |  |  |
| 1,6-dihydroxynaphthalene-type epoxy resin |  |  |  |  |  | 50 |
| 3,3'-diethyl-4,4'-diaminodiphenylmethane | 40 | 40 | 40 | 37 | 32 | 43 |
| 3,3'-5,5'-tetramethyl-4,4'diaminodiphenylmethane |  |  |  |  | 5 |  |
| Epoxidized polybutadiene elastomer | 6 | 6 | 6 | 6 | 6 | 6 |
| Spherical fused silica(1) | 340 | 230 | 230 | 340 | 300 | 260 |
| Spherical fused silica(2) | 40 | 160 |  | 40 |  | 110 |
| Spherical fused silica(3) |  |  |  |  | 80 |  |
| Spherical fused silica(4) |  |  | 160 |  |  |  |
| Composition viscosity (Pa · s) | 20 | 17 | 18 | 30 | 19 | 35 |
| Ease of package filling | good | good | good | good | good | good |
| Delamination after curing | 0 | 0 | 0 | 0 | 0 | 0 |
| Delamination after PCT | 0 | 0 | 0 | 0 | 0 | 0 |
| Delamination after T/C | 0 | 0 | 0 | 0 | 0 | 0 |
| Cracks after curing | 0 | 0 | 0 | 0 | 0 | 0 |
| Cracks after PCT | 0 | 0 | 0 | 0 | 0 | 0 |
| Cracks after T/C | 0 | 0 | 0 | 0 | 0 | 0 |
| Filler sedimentation($\mu$m) | 24 | ≦3 | ≦3 | 20 | 10 | 5 |

TABLE 2

| Comparative Example | 1 | 2 | 3 | 4 | 5 | 6 | 7 | 8 |
|---|---|---|---|---|---|---|---|---|
| Bisphenol-F-type epoxy resin | 100 | 100 | 100 | 100 | 100 | 30 | | |
| Bisphenol-A-type epoxy resin(1) | | | | | | | 100 | 100 |
| Bisphenol-A-type epoxy resin(2) | | | | | | 70 | | |
| Liquid Reaction Product(AA) | | | | | | | 43 | |
| Liquid Reaction Product(BB) | | | | | | | | 60 |
| 3'3'-diethyl-4,4'-diaminodiphenylmethane | 40 | 40 | 40 | 40 | 40 | 40 | | |
| Epoxidized polybutadiene elastomer | 6 | 6 | | 6 | 6 | 6 | 25 | 25 |
| Spherical fused silica(1) | 380 | 420 | 230 | 110 | | 340 | 430 | 300 |
| Spherical fused silica(2) | | 280 | 160 | 260 | | 40 | | |
| Spherical fused silica(5) | | | | | 380 | | | |
| Composition viscosity (Pa · s) | 30 | 120 | 17 | 130 | 27 | 125 | 160 | 140 |
| Ease of package filling | good | poor | good | poor | good | poor | poor | poor |
| Delamination after curing | 0 | — | 0 | — | 0 | — | — | — |
| Delamination after PCT | 0 | — | 3 | — | 0 | — | — | — |
| Delamination after T/C | 3 | — | 0 | — | 4 | — | — | — |
| Cracks after curing | 0 | — | 0 | — | 0 | — | — | — |
| Cracks after PCT | 0 | — | 3 | — | 0 | — | — | — |
| Cracks after T/C | 5 | — | 0 | — | 8 | — | — | — |
| Filler sedimentation(μm) | 80 | — | ≦3 | — | 100 | — | — | — |

What is claimed is:

1. A liquid epoxy resin potting material comprising component A, a liquid epoxy resin; component B, a liquid alkylated diaminodiphenylmethane; component C, an epoxidized polybutadiene elastomer; and component D, an inorganic filler, wherein the weight ratios of components A, B, C and D are:

A/(A+B)=about 0.65 to about 0.80

C/(A+B)=about 0.01 to about 0.05 and

D/(A+B+C+D)=about 0.50 to about 0.80.

2. The potting material of claim 1, wherein at least 50% by weight of component A has a viscosity not higher than 8Pa·s at 25° C.

3. The potting material of claim 1, wherein component A comprises an aromatic liquid epoxy resin.

4. The potting material of claim 3, wherein component A is selected from the group consisting of bisphenol-A diglycidyl ether-type epoxy resins; bisphenol-F diglycidyl ether-type epoxy resins; bisphenol-S diglycidyl ether-type epoxy resins; 3,3',5,5'-tetramethyl-4,4-dihydroxybiphenyl diglycidyl ether-type epoxy resins; 1,6-dihydroxynaphthalene diglycidyl ether-type epoxy resins; phenol novolak-type epoxy resins; cresol novolak-type epoxy resins; brominated bisphenol-A diglycidyl ether-type epoxy resins; brominated cresol novolak-type epoxy resins and combinations of two or more of the foregoing epoxy resins.

5. The potting material of claim 1, wherein component B comprises a diaminodiphenylmethane in which at least one of the hydrogen atoms of the benzene rings is substituted by a $C_1$–$C_4$ alkyl group.

6. The potting material of claim 5, wherein the diaminodiphenylmethane is selected from the group consisting of 3,3'-diethyl-4,4'-diaminodiphenylmethane; 3,3',5,5'-tetramethyl-4,4'-diaminodiphenylmethane; 3,3',5,5'-tetraethyl-4,4'-diaminodiphenylmethane and mixtures thereof.

7. The potting material of claim 1, wherein the epoxidized polybutadiene elastomer has a number average molecular weight of about 1,000 to about 5,000.

8. The potting material of claim 1, wherein the epoxidized polybutadiene elastomer contains about 3 to about 10 mole % epoxy groups in the molecule.

9. The potting material of claim 1, wherein component D comprises a spherical silica.

10. The potting material of claim 1, wherein component D comprises a combination of a spherical silica(1) having an average particle size of about 0.1 to about 3.0 μm and a maximum particle size of about 10 μm, and spherical silica(2) having an average particle size about 4 to about 10 μm and a maximum particle size of about 50 μm.

11. The potting material of claim 10, wherein the weight ratio of silica(1) to silica(2) is such that the weight of silica(1) divided by the combined weight of silica(1) plus silica(2) is in the range of about 0.05 to about 0.50.

* * * * *